United States Patent
Huang et al.

(10) Patent No.: US 9,443,996 B2
(45) Date of Patent: Sep. 13, 2016

(54) DIELECTRIC STRUCTURE FOR COLOR FILTER ARRAY

(71) Applicant: Taiwan Semiconductor Manufacturing Co., Ltd., Hsin-Chu (TW)

(72) Inventors: Yin Chieh Huang, Tainan (TW); Kuo-Cheng Lee, Tainan (TW); Chi-Cherng Jeng, Madou Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/943,907

(22) Filed: Jul. 17, 2013

(65) Prior Publication Data
US 2015/0021728 A1    Jan. 22, 2015

(51) Int. Cl.
*H01L 31/0232*    (2014.01)
*H01L 31/18*    (2006.01)
*H01L 27/146*    (2006.01)

(52) U.S. Cl.
CPC ..... *H01L 31/0232* (2013.01); *H01L 27/14621* (2013.01); *H01L 27/14667* (2013.01); *H01L 31/18* (2013.01)

(58) Field of Classification Search
CPC .......... H01L 27/14627; H01L 31/0232; H01L 27/14685; H01L 33/44; H01L 27/14643; H01L 27/167; H01L 27/3227; H01L 31/02024; H01L 31/0203; H01L 31/0284

USPC ................... 257/431, 294; 438/14
See application file for complete search history.

(56) References Cited

U.S. PATENT DOCUMENTS

| | | |
|---|---|---|
| 5,990,506 A | 11/1999 | Fossum et al. |
| 6,168,966 B1 | 1/2001 | Fan et al. |
| 7,196,388 B2 * | 3/2007 | Wu ................... H01L 27/14627 257/431 |
| 7,737,479 B2 | 6/2010 | Wen et al. |
| 2006/0049476 A1 * | 3/2006 | Koizumi et al. ............. 257/432 |
| 2009/0078974 A1 * | 3/2009 | Nagai ............... H01L 27/14625 257/292 |
| 2009/0315131 A1 * | 12/2009 | Hung ................ H01L 27/14621 257/432 |
| 2010/0244287 A1 * | 9/2010 | Hsu ...................... G03F 7/70633 257/797 |
| 2012/0044395 A1 * | 2/2012 | Del Monte ....... H01L 27/14629 348/273 |
| 2013/0034929 A1 | 2/2013 | Su et al. |
| 2013/0084660 A1 * | 4/2013 | Lu ....................... H01L 31/1864 438/14 |

* cited by examiner

*Primary Examiner* — Kenneth Parker
*Assistant Examiner* — Bo Fan
(74) *Attorney, Agent, or Firm* — Eschweiler & Associates, LLC

(57) ABSTRACT

An integrated circuit device in which an array of photodiodes are formed at the surface of a semiconductor substrate. A dielectric structure comprising multiple layers of dielectric is formed over the photodiodes. An array of color filters is formed over the photodiodes and within the dielectric structure. An interface between two layers of the dielectric structure is aligned with the bases of the color filters. The interface provides an etch stops that allows the depths of the trenches in which the color filters are formed to be well controlled.

20 Claims, 4 Drawing Sheets

DIELECTRIC STRUCTURE FOR COLOR FILTER ARRAY

FIELD

The present disclosure provides image sensors for integrated circuit devices and methods for their manufacture.

BACKGROUND

Image sensors are used in PC cameras, cell phones, and other applications. Charge-coupled device (CCD) image sensors were once popular, but have since been largely replaced by complementary metal-oxide semiconductor (CMOS) image sensors. CMOS image sensors include passive pixel sensors (PPS) and active pixel sensors (APS). An APS includes at least one photodiode and an amplifier within each cell of the pixel array. The amplifier can be configured as a source follower driven by the pixel itself.

Color filters can be arrayed over the pixel cells to provide color image sensing. A typical color filter array has three or four distinct filters types arranged in a grid pattern. Examples of color filter arrays include Bayer filters with red, green and blue filter types, CYGM filters (cyan, yellow, green, magenta) and RGBE filters (red, green, blue, emerald). A blue color filter could have a maximum transmission rate at about 450 nm and a 50 nm spectrum width through which transmission is within 50% of that maximum. A green color filter could have a maximum transmission rate at about 550 nm and a 50 nm spectrum width through which transmission is within 50% of that maximum. A red color filter will typically transmit into the near infrared unless combined with an infrared cut-off filter. With the infrared cut-off filter, the red color filer could have a maximum transmission rate at about 630 nm and a 50 nm spectrum width through which transmission is within 50% of that maximum.

DETAILED DESCRIPTION

The present disclosure provides a method of manufacturing an integrated circuit device having photodiodes and color filters. The method include forming a dielectric structure including a first dielectric layer, a second dielectric layer, and optionally a third dielectric layer. An array of trenches is etched into the dielectric structure. The trenches are etched to the depth of an interface between two of the dielectric layers. Color filters are formed in the trenches. The method allows the depths of the trenches and therefore the thickness of the color filters to be well controlled.

The present disclosure also provides an integrated circuit device having an array of photodiodes, an array of color filters, and a continuous dielectric structure. The photodiodes are formed at the surface of a semiconductor substrate. The bases of the color filters are aligned along a plane. The continuous dielectric structure includes a thickness of dielectric separating the bases of the color filters from the photodiodes. The continuous dielectric structure also includes dielectric in the form of a grid separating adjacent color filters in the array. The continuous dielectric structure has a transition in composition occurring along a plane that is parallel to and proximate the plane along which the bases of the color filters are aligned. The dielectric structure facilitates providing the color filters in a desired thickness.

Figure 1:
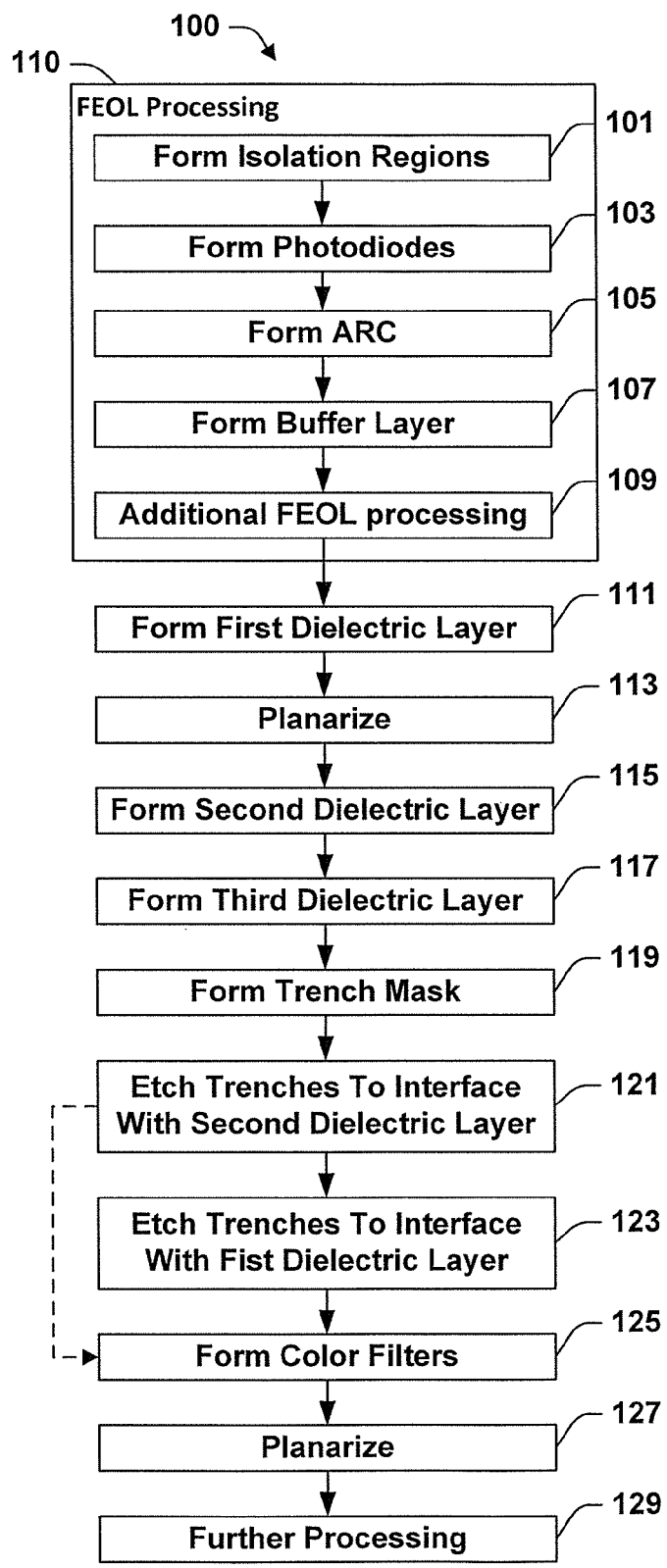
FIG. 1 is flow chart of an example method according to some embodiments of the present disclosure.

FIG. 1 provides a flow chart of a method 100 according to some embodiments of the present disclosure. FIGS. 2-8 illustrate an integrated circuit device 200, also provided by the present disclosure, at various stages of manufacture according to the method 100. The method 100 begins with conventional front-end of line (FEOL) processing 110. FEOL processing 100 can include action 101, forming isolation regions 229 in a semiconductor substrate 201 and action 103, forming photodiodes 231 at the surface 202 of the semiconductor substrate 201.

Conventional FEOL processing 110 optionally includes additional actions. Action 105 is forming an optional anti-reflective coating 203 over the surface 202. Action 107 is forming an optional buffer layer 205 over the antireflective coating 203. The actions included within FEOL processing 110 can be carried out in any suitable order. Action 109 is additional FEOL processing, indicating that subsequent actions are carried out during back-end of line (BEOL) processing. The actions illustrated by FIG. 1 as following action 109 are carried out as part of BEOL processing in most embodiments, but it is not required that any of these actions be deferred to BEOL processing.

Figure 2:
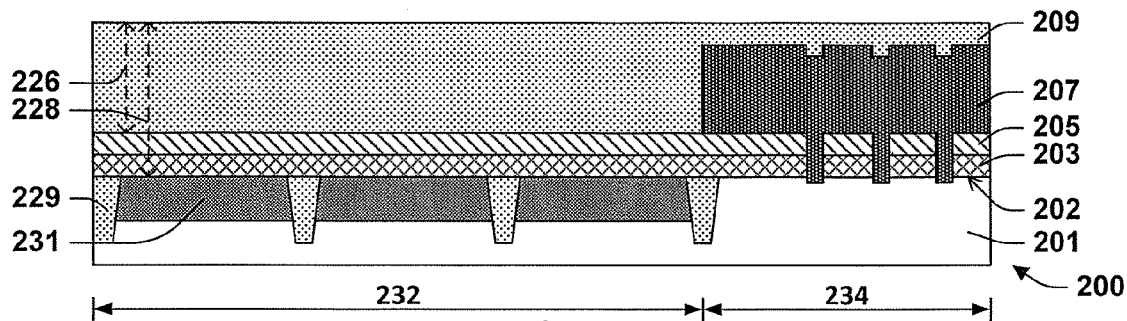
FIGS. 2-8 illustrate at various stages of manufacture an integrated circuit device according to some embodiments of the present disclosure.

Action 111 is forming a first dielectric layer 209 and action 113 is an optional step of planarizing that layer. FIG. 2 provides an example of a resulting structure. In the example of FIG. 2, the first dielectric layer 209 covers a metal interconnect structure 207 formed above the surface 202. Due to the presence of such structures, and for other reasons, the height 228 of the dielectric 209 over the surface 202 can vary. The method 100 facilitates forming trenches of uniform depth in spite of any such variations.

Figure 3:
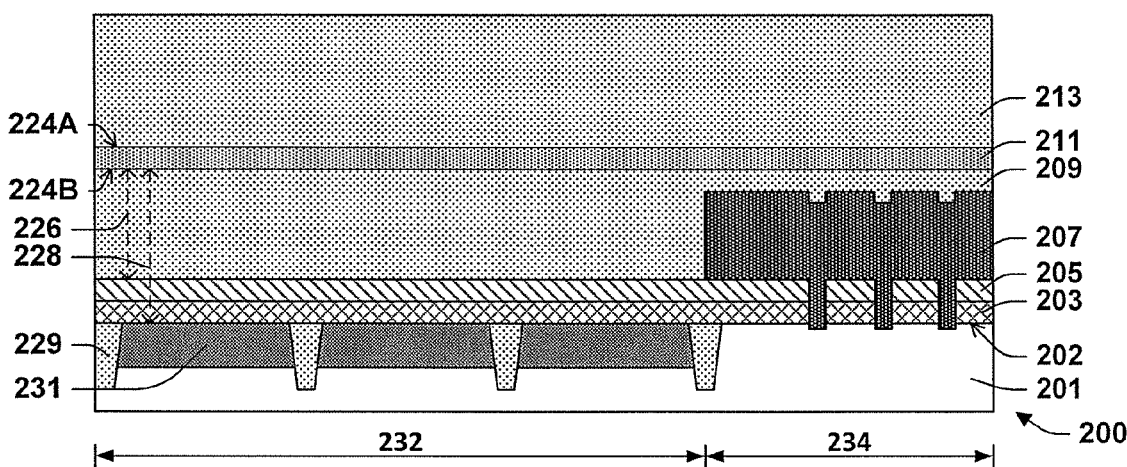

Action 115 forms a second dielectric layer 211 over the first dielectric layer 209. In subsequent processing, trenches will be formed bottoming either on the second dielectric 221 or near the interface between the second dielectric layer 211 and the first dielectric layer 209. To serve either case, the second dielectric layer 211 has a distinct composition from the first dielectric layer 209. Optionally, the second dielectric layer 211 is planarized before further processing takes place. Action 117 forms a third dielectric layer 213 over the second dielectric layer 211 to provide a structure as illustrated in FIG. 3. Optionally, the third dielectric layer 213 is also planarized before further processing takes place.

In most embodiments the second dielectric layer 211 is an etch stop layer that is thin in comparison to the first dielectric layer 209 and the third dielectric layer 213. In most embodiments the second dielectric layer 211 has a composition distinct from either of those layers. Making the second dielectric layer 211 an etch stop layer provides the most accurate control over the depth of subsequently formed trenches.

In some other embodiments, the second dielectric layer 211 has the same composition as the third dielectric layer 213. Viewed another way, in some embodiments, action 117 is not included (skipped), the third dielectric layer 213 is not formed, and the second dielectric layer 211 is thicker than just an etch stop layer.

Figure 4:
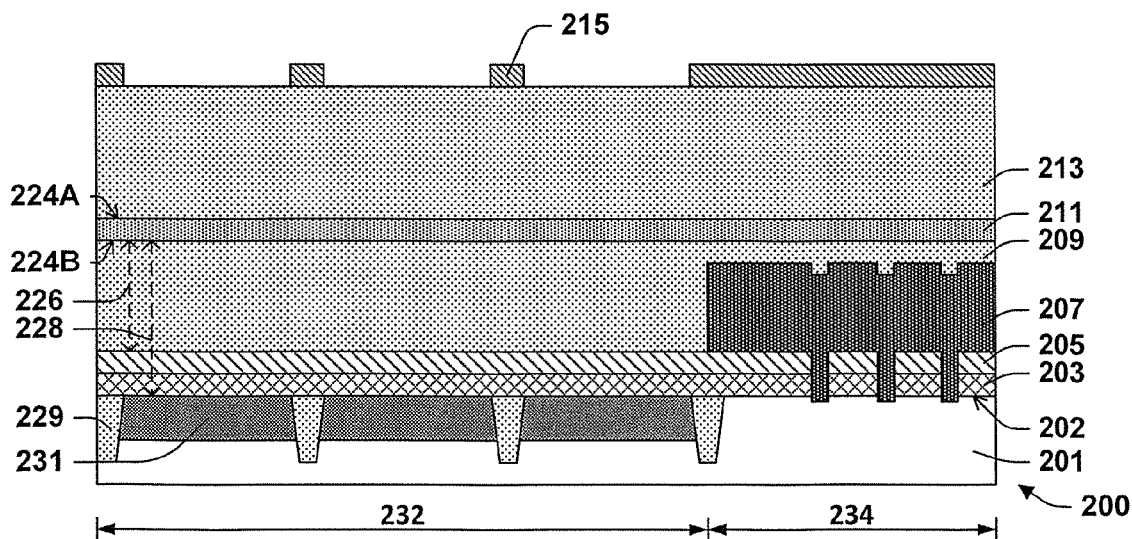
Figure 5:
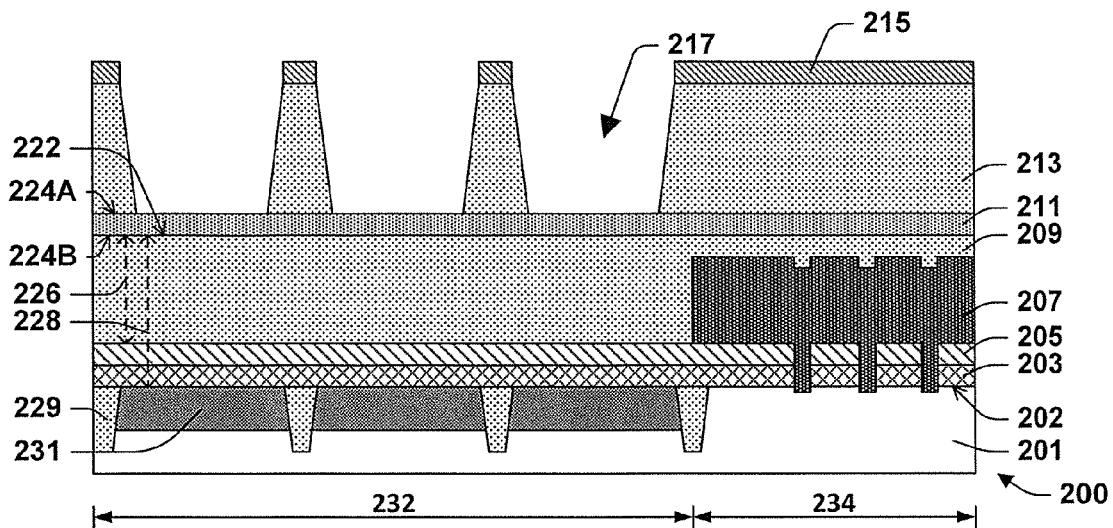

Action 119 is forming a mask 215 as shown in FIG. 4 over the dielectric structure that includes the first dielectric layer 209, the second dielectric layer 211, and optionally the third dielectric layer 213. The mask 215 is patterned according to the desired locations for trenches 217. In some embodiments, the trenches 217 form an array with one trench 217 formed over each photodiode 231. The mask 215 can be patterned by photolithography Action 121 is etching trenches 217 to the depth of an interface 224 between the second dielectric layer 211 and either the third dielectric layer 213 (interface 224A) or the first dielectric layer 209 (interface 224B). In some embodiments, the etch process 121 has conditions for preferentially removing the material of the upper of the two layers in comparison to the material of the lower of the two layers. Under such conditions, the lower layer is operative as an etch stop.

In some embodiments, the etch process 121 includes terminating the etch process 121 based on an analysis of the byproducts of etching. For example, the upper layer can be a dielectric layer 213 having the composition $SiO_2$ while the lower layer is a dielectric layer 211 having the composition SiN. The exhaust gas from the chamber in which etching takes place can be monitored for the appearance of certain nitrogen compounds that indicate the etch has reached the depth of interface 224A and dielectric layer 211 is being etched. The etch process 121 can terminate as soon as these byproducts are detected. Other ways in which the etch process 121 can be terminated based on the analysis of the byproducts of etching include, without limitation, terminating the etch process 121 when the concentrations of byproducts of etching the layer 211 level off after a period of steady increase (indicating the layer 211 is fully exposed at the bottoms of the trenches 217) and terminating the etch process 121 a fixed period of time after the byproducts of etching the layer 211 are first detected.

Figure 9:
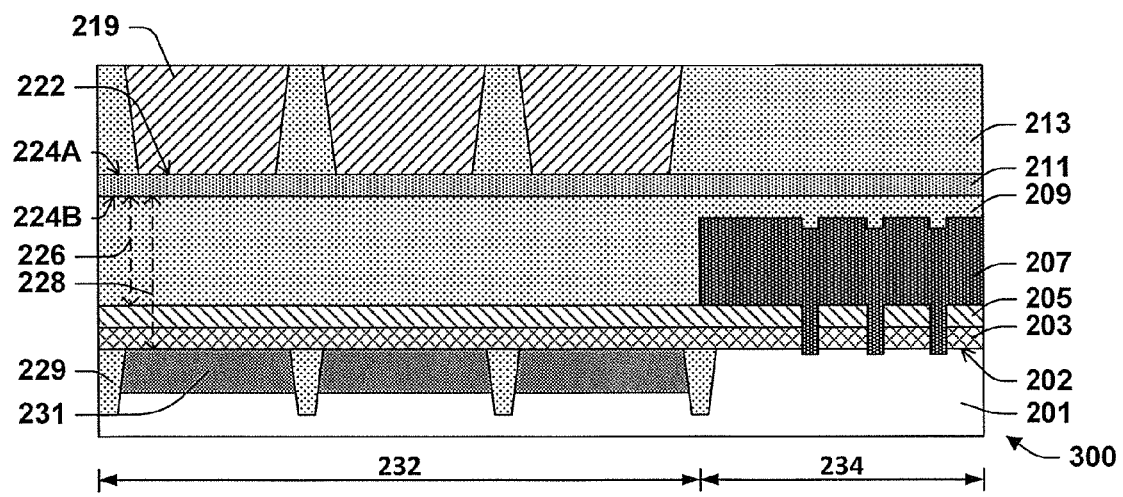
FIG. 9 illustrates an integrated circuit device according to some other embodiments of the present disclosure.

In some embodiments, the process 100 proceeds with an additional etch process 123, while in other embodiments the process 100 proceeds directly to action 125, forming color filters 219. The additional etch 123 is not applied in embodiments where the trenches 217 are etched only to the depth of the interface 224A. In some other embodiments, the additional etch 123 is skipped and the color filters 219 are formed above the second dielectric layer 211 as shown in FIG. 9.

Figure 6:
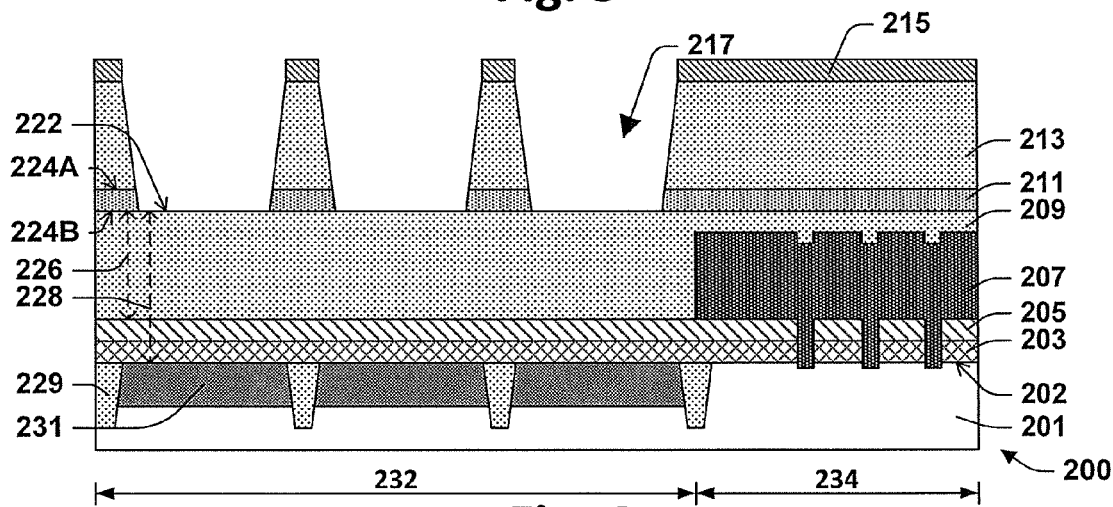

The etch process 123 extend the trenches 217 to the depth of the interface 224B, which is between the second dielectric layer 211 and the first dielectric layer 209 as shown in FIG. 6. In some embodiments, the etch process 123 has conditions for preferentially removing the material of the second dielectric layer 211 in comparison to the material of the first dielectric layer 209.

In some embodiments, the etch process 123 includes terminating the etch process 123 based on an analysis of the byproducts of etching. For example, the second dielectric layer 211 can have the composition SiON while the first dielectric layer 209 has the composition $SiO_2$. The concentrations of nitrogen-containing byproducts of etching SION can be monitored in the etch process exhaust gas. The etch process 123 can be terminated when those concentration fall to a level that indicates the trenches 217 have reached the depth of interface 224B. In some other embodiments, the etch process 123 proceeds for a predetermined period of additional time sufficient to assure that the trenches 217 have all been etched completely through the second dielectric layer 211.

Figure 7:
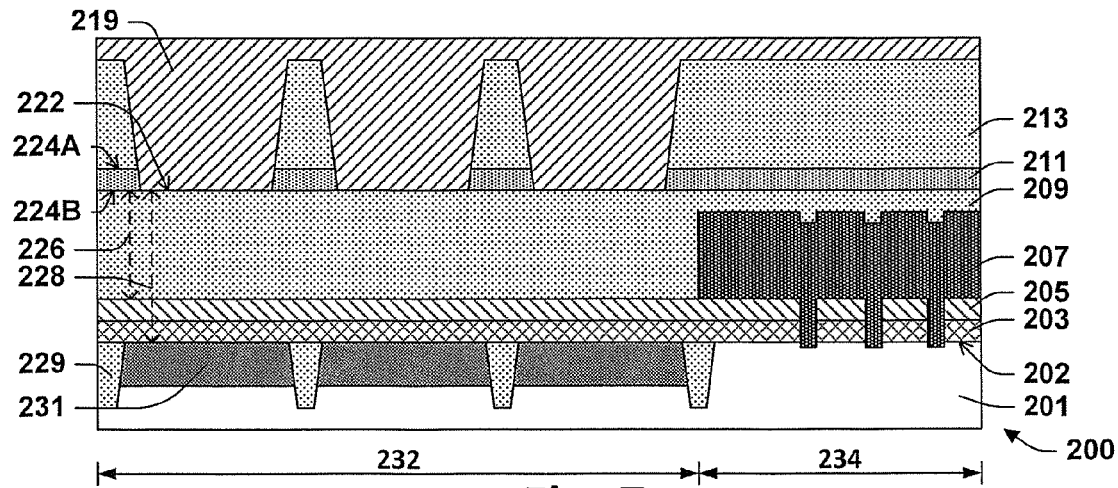
Figure 8:
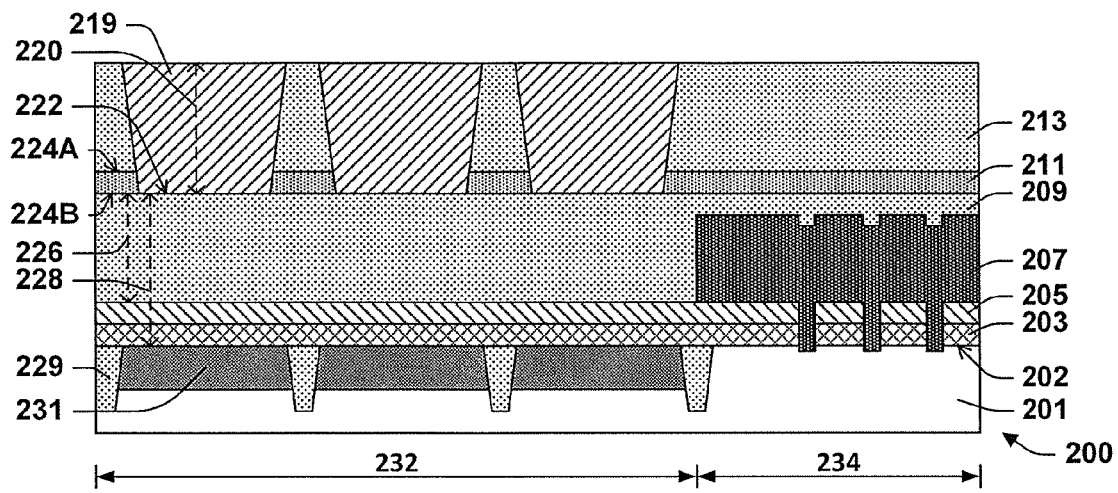

Action 125 is filling the trenches 217 with a material that forms color filters 219. As illustrated in FIG. 7, the color filter material 219 can be filled to above the level of trenches 217, in which case the process 100 includes the action 127, planarization to remove the color filter material 219 that is outside the trenches 217 to provide the structure as shown in FIG. 8. FIG. 9 shows the same structure for a nearly equivalent device 300, which provides an example for embodiments in which trenches 217 are formed only to the depth of the interface 224A. A planarization process can be, for example, chemical mechanical polishing.

Action 129 is further processing. Further processing 129 generally includes additional processing such as forming lens (not shown) over the color filters 219 and additional BEOL processing. Further processing 129 can also include forming additional color filters 219A of different type than color filters 219.

In some embodiments substrate 201 includes a semiconductor body. Examples of semiconductors include, without limitation, silicon, silicon on insulator (SOI), Ge, SiC, GaAs, GaAlAs, InP, GaN SiGe. Photodiodes are formed in and over the substrate 201 within the region 232. Other devices are formed in and over the substrate 201 within the region 234.

Isolation regions 229 can be isolation structures of any suitable types. Examples of suitable isolation structures include, without limitation, shallow trench isolation (STI) regions and deep well isolation regions. Deep well isolation regions have the advantage of reducing leakage currents.

Photodiodes 231 can be of any suitable types. In some embodiments, photodiodes 231 are active pixel sensors. Examples of active pixel sensors include, without limitation, three transistor (3-T) and four transistor (4-T) cells. Antireflective coating 203 and buffer layer 205 are optional structures. If included, these structures can be of any suitable type or composition used in connection with active pixel sensor cells.

The region 234 can include one or more device structures formed during front-end of line (FEOL) processing Device structures formed during FEOL processing can include, without limitation, memory devices, logical devices, FETs and components thereof such as source regions, drain regions, and gate electrodes, active devices, passive devices, and combinations thereof. The region 234 can also include insulators, conductors, and interconnect structures formed during back-end of line (BEOL) processing. In most embodiments, the dielectric layer 209 covers one or more structures, such as the metal interconnect structure 207, formed within the region 234 and rising above the level of the surface 202.

First dielectric layer 209, second dielectric layer 211, and third dielectric layer 213 can be formed by any suitable deposition techniques. Deposition techniques that can be suitable include, without limitation chemical vapor deposition, plasma deposition, and spin-on techniques. Suitable composition for the dielectric layers include, without limitation, silicon dioxide, silicon nitride, silicon oxynitride, SiOCN, and silicate glasses.

The first dielectric layer 209, the second dielectric layer 211, and the third dielectric layer 213, where the later is present, form a continuous dielectric structure including a thickness 226 of dielectric separating the color filters 219 from the surface 202 of the semiconductor substrate 201. In some embodiment, the continuous dielectric structure further includes a thin layer formed by the second dielectric 211 and having a composition distinct from that of the dielectric structure above and below the thin layer. The composition above the thin layer corresponds to the third dielectric 213. The composition below the thin layer corresponds to the first dielectric 209. In most embodiments, the continuous dielectric structure has an interface that is coplanar with the plane 222 along which the bases of the color filters 219 are aligned.

In most embodiments, the second dielectric layer 211 abuts or lies very close to a plane 222 along which the bases of the color filters 219 are aligned. In some embodiments, such as the one illustrated by the device 200 as shown in FIG. 8, the base of the second dielectric layer 211 is parallel to and proximate the plane 222. In some other embodiments, such as the one illustrated by the device 300 as shown in FIG. 9, the top of the second dielectric layer 211 is parallel to and proximate the plane 222. Proximate is used in the sense of being very close or abutting. The closeness reflects the use of the transition in dielectric composition to provide an etch stop.

In some embodiments, such as the one illustrated by the device 400 as shown in FIG. 13, there are color filters (219 and 219A) of different thicknesses having bases that are aligned along a plane 222. Put another way, in some embodiments there are color filters 219 of various types, but all the color filters are and equal distance 228 above the surface 202 of the substrate 201.

Color filters 219 can be of an suitable type and can be formed by any suitable method. In some embodiments, the color filters 219 are dyes or pigments in a polymer matrix. In some other embodiments, the color filters 219 are guided-mode resonance filters based on sub-wavelength dielectric grating. In some other embodiments, the color filters 219 are plasmonic color filters. In some embodiments, the color filters 219 are formed from a liquid precursor that fills the trenches 217.

The disclosure provides an integrated circuit device in which an array of photodiodes are formed at the surface of a semiconductor substrate. A dielectric structure comprising multiple layers of dielectric is formed over the photodiodes. An array of color filters is formed over the photodiodes and within the dielectric structure. An interface between two layers of the dielectric structure is aligned with the bases of the color filters.

The disclosure also provides an integrated circuit device comprising an array of photodiodes formed at the surface of a semiconductor substrate, and array of color filters formed over the photodiodes, and an etch stop layer. The etch stop layer is aligned with the bases of the color filters.

The disclosure provides a method of manufacturing an integrated circuit device. The method includes forming an array of photodiode cells at the surface of a semiconductor substrate, forming a dielectric structure including multiple layers of dielectric over the photodiodes, etching trenches in the dielectric structure, and forming color filters within the trenches. In etching the trenches, one of the dielectric layers provides an etch stop.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. An integrated circuit device, comprising:
a semiconductor substrate having a surface;
an array of photodiodes disposed along the surface;
a dielectric structure disposed over the array of photodiodes, the dielectric structure comprising a first dielectric layer overlying a second dielectric layer and an etch stop layer arranged between the first dielectric layer and the second dielectric layer, wherein the first dielectric layer and the etch stop layer have different chemical compositions;
an array of color filters comprising a plurality of color filters disposed within the dielectric structure and having bottom surfaces that are arranged in direct contact with the second dielectric layer, wherein the first dielectric layer is disposed at positions laterally separating adjacent color filters within the array of color filters; and
a metal interconnect arranged over the semiconductor substrate, wherein the metal interconnect extends from the semiconductor substrate, through an anti-reflective layer arranged onto the semiconductor substrate and a buffer layer arranged onto the anti-reflective layer, to a top surface of the metal interconnect vertically below the etch stop layer and laterally offset from the array of photodiodes.

2. The integrated circuit device of claim 1,
wherein the first dielectric layer and the second dielectric layer comprise silicon dioxide ($SiO_2$); and
wherein the etch stop layer comprises silicon nitride, silicon oxynitride or silicon oxy carbonitride.

3. The integrated circuit device of claim 1, wherein the color filters are disposed over a top surface of the second dielectric layer.

4. An integrated circuit device, comprising:
a semiconductor substrate having a surface;
an array of photodiodes formed at the surface;
an etch stop layer disposed above the array of photodiodes and laterally extending beyond the array of photodiodes;
an array of color filters disposed above the array of photodiodes and having bottom surfaces that are arranged directly on and in contact with an upper surface of the etch stop layer;
a first dielectric layer, having a different chemical composition from the etch stop layer, which is disposed above the etch stop layer at positions laterally separating adjacent color filters within the array of color filters; and
a metal interconnect arranged over the semiconductor substrate, wherein the metal interconnect extends from the semiconductor substrate, through an anti-reflective layer arranged onto the semiconductor substrate and a buffer layer arranged onto the anti-reflective layer, to a top surface of the metal interconnect vertically below the etch stop layer and laterally offset from the array of photodiodes.

5. The integrated circuit device of claim 4, wherein the first dielectric layer and a top surface of the etch stop layer share an interface.

6. The integrated circuit device of claim 1, wherein the dielectric structure laterally extends beyond the array of photodiodes.

7. The integrated circuit device of claim 1, wherein color filters extend from a top surface of the first dielectric layer to a top surface of the second dielectric layer.

8. The integrated circuit device of claim 4, further comprising isolation regions within the semiconductor substrate separating each photodiode.

9. The integrated circuit device of claim 4, further comprising a second dielectric layer disposed below the etch stop layer which has a different chemical composition than the etch stop layer.

10. The integrated circuit device of claim 4, wherein the color filters abut the first dielectric layer at angled sidewalls having an angle of less than ninety degrees with respect to a lower surface of the first dielectric layer.

11. The integrated circuit device of claim 4, wherein color filters extend from a top surface of the first dielectric layer to a top surface of the etch stop layer.

12. An integrated circuit (IC) device comprising:
a semiconductor substrate;
an array of photodiodes disposed within the semiconductor substrate;
a dielectric structure disposed above the semiconductor substrate, the dielectric structure comprising an etch stop layer overlying a first dielectric layer and a second dielectric layer overlying the etch stop layer, wherein a chemical composition of the first and second dielectric layers is different from the chemical composition of the etch stop layer;
an array of color filters disposed above the array of photodiodes and having bottom surfaces that are arranged directly on and in contact with an upper surface of the etch stop layer, wherein adjacent color filters of the array of color filters are separated by the second dielectric layer;
isolation regions disposed within the semiconductor substrate, separating each photodiode;
an anti-reflective layer disposed above a top surface of the semiconductor substrate;
a buffer layer disposed above the anti-reflective layer; and
a metal interconnect disposed above the buffer layer, wherein the metal interconnect extends from the semiconductor substrate, through the buffer layer and the anti-reflective layer, to a top surface of the metal interconnect that resides vertically below the etch stop layer and laterally offset from the array of photodiodes.

13. The IC device of claim 12, wherein the color filters extend from a top surface of the second dielectric layer to a top surface of the etch stop layer.

14. The IC device of claim 12, wherein the color filters abut the second dielectric layer at angled sidewalls having an angle of less than ninety degrees with respect to a lower surface of the first dielectric layer.

15. The integrated circuit device of claim 1, wherein the etch stop layer has a thickness that is less than a thickness of the first dielectric layer.

16. The IC device of claim 12, wherein no metal interconnect layers are arranged within the dielectric structure at locations vertically between the array of color filters and the array of photodiodes and within lateral confines of the array of color filters and the array of photodiodes.

17. The integrated circuit device of claim 1, wherein the plurality of color filters have top surfaces that are co-planar with a top surface of the first dielectric layer.

18. The integrated circuit device of claim 17, wherein the plurality of color filters have outermost top edges that contact the first dielectric layer.

19. The integrated circuit device of claim 4, wherein the array of color filters comprise a plurality of color filters having top surfaces that are co-planar with a top surface of the first dielectric layer.

20. The integrated circuit device of claim 19, wherein the plurality of color filters have outermost top edges that contact the first dielectric layer.

* * * * *